United States Patent [19]

Takai et al.

[11] 4,308,596
[45] Dec. 29, 1981

[54] MEMORY DRIVING METHOD

[75] Inventors: Atsushi Takai, Musashino; Yuzo Kita, Fuchu; Yoshimune Hagiwara, Kodaira; Terumi Sawase, Hachioji; Takaaki Hagiwara, Kodaira, all of Japan

[73] Assignee: Hitachi, Ltd., Tokyo, Japan

[21] Appl. No.: 81,890

[22] Filed: Oct. 4, 1979

[30] Foreign Application Priority Data

Oct. 9, 1978 [JP] Japan .................................. 53/123625

[51] Int. Cl.³ ...................... G11C 11/40; G11C 13/00
[52] U.S. Cl. ..................................... 365/218; 365/174
[58] Field of Search ................. 307/238; 365/218, 174

[56] References Cited

U.S. PATENT DOCUMENTS 3,875,567  4/1975  Yamazaki ............................ 365/218

Primary Examiner—Terrell W. Fears
Attorney, Agent, or Firm—Craig and Antonelli

[57] ABSTRACT

In a memory array of memory cells each having at least a gate, a substrate, a source and a drain, a writing operation is effected when the substrate and the source and drain are at the same potential and when a potential difference $V_p$ exists between the potential of the substrate and the source and drain and that at the gate. The stored contents are erased when a potential difference $V_p$ exists between the gate and the substrate. The stored condition is prevented from changing when a potential difference $V_p$ exists between the substrate and the gate and when a potential difference $V_{wd}$ exists between the substrate and the source and drain. When such a memory array is partially erased, cells not to be erased are sequentially driven by applying a voltage $V_{wd}$ between the source and drain and the substrate of the cell, applying a voltage $V_p$ between the gate and the substrate of the cell, and applying the same potential to the substrate and the gate of the cell.

9 Claims, 9 Drawing Figures

PRIOR ART

MEMORY DRIVING METHOD

BACKGROUND OF THE INVENTION

The present invention relates to a method of driving an electrically alterable read only memory (hereinafter referred to as EAROM) formed of metal-silicon nitride-silicon oxide-semiconductor (hereinafter referred to as MNOS) transistors or the like at the time of partially erasing (word erasing).

Figure 1:
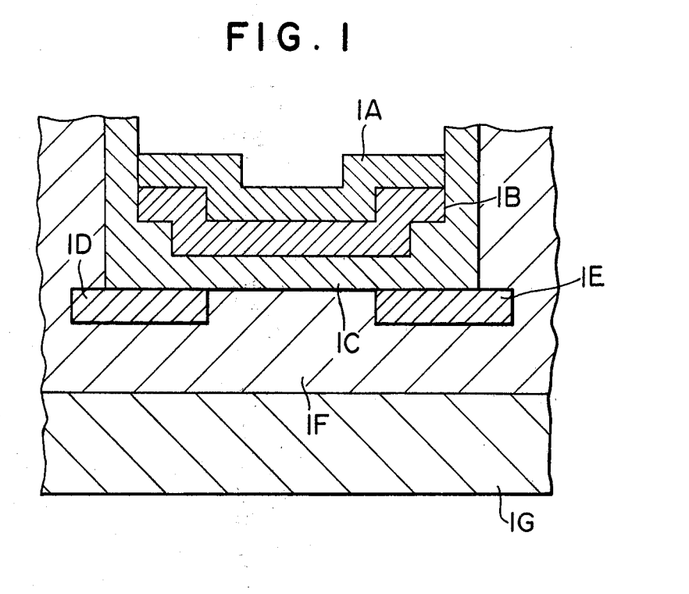
FIG. 1 is a cross-sectional view of an MNOS transistor.

FIG. 1 shows a cross-section of a MNOS transistor structure used for an EAROM cell of this kind. Referring to FIG. 1, there are shown a gate electrode 1A, a silicon nitride $Si_3N_4$ layer 1B, a silicon oxide $SiO_2$ layer 1C, a source 1D, a drain 1E, a substrate 1F and a wafer substrate 1G.

When a voltage $V_p$ is applied to the gate 1A of the MNOS transistor and a potential of zero volts is applied to the substrate 1F, source 1D and drain 1F, electric charges are trapped at the interface of the silicon oxide $SiO_2$ layer 1C and the silicon nitride $Si_3N_4$ layer 1B. When, for example, the potential $V_p$ of +25 volts is applied to the gate of an N-channel MNOS transistor, electrons are trapped at the boundary between the $SiO_2$ layer 1C and the $Si_3N_4$ layer 1B. This condition is hereinafter called a "written state" of memory and defined as a stored condition of logic "1." This voltage $V_p$ varies depending on the kind of the element used, the duration of the potential application, etc.

On the other hand, when the voltage $V_p$ is applied to the substrate 1F with the gate 1A at zero volts and the source 1D and the drain 1E are brought into an open condition, the trapped charges disappear from the boundary between the silicon oxide $SiO_2$ layer 1C and the silicon nitride $Si_3N_4$ layer 1B. Such a condition is hereinafter referred to as an "erased state" of memory and defined as a stored condition of logic "0."

If a certain voltage $V_{wd}$ is applied to the source 1D and drain 1E under the condition that there is no potential difference between the gate 1A and substrate 1F of the MNOS transistor or even that the voltage $V_p$ is applied to the gate 1A with the substrate 1F at zero volts, the stored condition of the memory is not changed from logic "0" to logic "1" or vice versa. This corresponds to the case where, for example, an N-channel MNOS transistor is applied with 25 volts of $V_p$ and 20 volts of $V_{wd}$. The voltage $V_{wd}$ varies depending on the kind of the element, etc.

If the voltage $V_p$ is applied to the substrate 1F with the gate at zero volts under the condition that the voltage $V_{wd}$ is applied to the source 1D and drain 1E, the content of the memory is erased as apparent from the structure.

In the case where an integrated memory array is made of such memory cells and only selected memory cells are desired to be erased for rewriting, the application of voltage must be carried out in a mode (non-erasing mode) at which the contents of the other non-selected memory cells are not erased.

Figure 2:
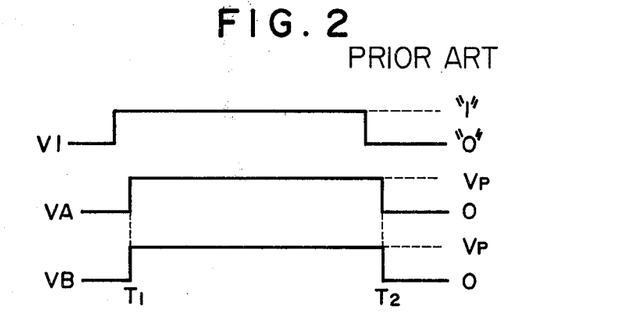
FIGS. 2 to 3 are each a conventionally used timing chart of voltages applied to memory cells not to be erased when a memory is partially erased.

FIG. 2 is a timing chart of signals according to a conventional memory driving method, which shows the relation between the signals to be applied to non-selected memory cells (not to be erased) when some selected memory cells are in the erase state. In the figure, V1 is an erasing operation signal to be applied to the memory. When the signal V1 is a "1" level, an erasing operation is performed so that the contents of selected memory cells of the memory are erased. VA is a voltage to be applied to the gates 1A of non-selected memory cells and VB is a voltage to be applied to the substrates 1F of those non-selected memory cells. When the erasing operation signal V1 becomes logic "1," the voltages VA and VB at the gates 1A and substrates 1F of the non-selected memory cells rise to the same voltage $V_p$ (at time instant $T_1$). When the erasing operation signal V1 becomes logic "0," the voltages VA and VB fall off to zero volts (at time instant $T_2$). At this time, the sources 1D and drains 1E of the non-selected memory cells are in the open condition.

Since the voltages at the gate 1A and substrate 1F change quite similarly in the non-erasing mode as shown in FIG. 2, there is no potential difference between the gate 1A and the substrate 1F and thus there is no effect on the stored condition of the non-selected memory cells.

Figure 3:
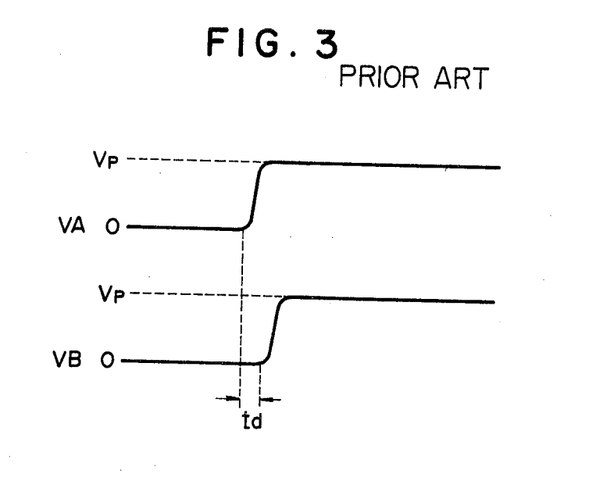

In practice, however, even when the voltage $V_p$ is simultaneously applied to the gate 1A and the substrate 1F, a well capacity or the like between the substrate 1F and the wafer substrate 1G frequently causes a small time difference $t_d$ between the gate voltage VA and the substrate voltage VB, as shown in FIG. 3. In a transient condition during the time $t_d$, since the voltage $V_p$ is applied to the gate 1A and the substrate 1F is at zero volts, the corresponding memory cell is instantly brought into the write condition if the source 1D and the drain 1E are at zero volts. Through this time difference $t_d$ is generally much shorter than the time $T_w$ that it takes to write, the stored condition of some non-selected memory cells whose gates 1A are applied with this voltage $V_p$ may be changed if such a transient write operation occurs several times in sequence. This fact has affected so far the normal operation of the EAROM to reduce its storage time.

If, for example, the leading edge of the voltage $V_p$ at the gates 1A of some memory cells is 100 μsec faster than that at the substrates 1F, that is, there is the time difference $t_d$ of 100 μsec, and if the $T_w$ of memory is 250 msec, then the ratio $T_w/t_d$ is 2500, which means that when erasing operation on the other memory cells is performed 2500 times or more, the condition of the non-selected memory cells not to be erased changes to logic "1" from logic "0."

In addition, there is a possibility that the substrate voltage VB instantly changes to the $V_p$ with zero gate voltage. In this case, the corresponding memory cell is brought into the erased condition in a moment.

SUMMARY OF THE INVENTION

An object of the present invention is to provide a memory driving method which prevents non-selected memory cells other than selected memory cells to be erased from being instantly brought into a written or erased condition when the EAROM is partially erased as described above.

The present invention employs a different voltage application sequence different from the prior art, and this voltage application to each terminal of non-selected memory cells prevents the contents of the non-selected memory cells from changing.

More specifically, the invention makes use of a fact that as described previously, when the gate voltage is at $V_p$, the substrate voltage is at zero volts, and the source and drain voltages are at $V_{wd}$, then no change occurs in the contents of the corresponding memory cells. Thus, when an erasing operation signal is applied, a potential $V_{wd}$ is first applied to the sources 1D of the non-selected memory cells except the selected memory cells to be erased, and subsequently the voltage $V_p$ is applied to the gates 1A thereof. Then, the substrate 1F is applied with $V_p$. When the erasing operation signal is not applied, the source remains at $V_{wd}$. Thereafter, the potential of the substrate 1F is changed from $V_p$ to zero, and next the potential at the gate 1A is reduced to zero. In this way, even when voltage $V_p$ is applied to the gate 1A and zero volts to the substrate 1F, transiently, the source 1D and drain 1E are at $V_{wd}$ thereby preventing the contents of the non-selected memory cells from changing.

DETAILED DESCRIPTION OF THE PREFERRED EMBODIMENTS

Figure 4:
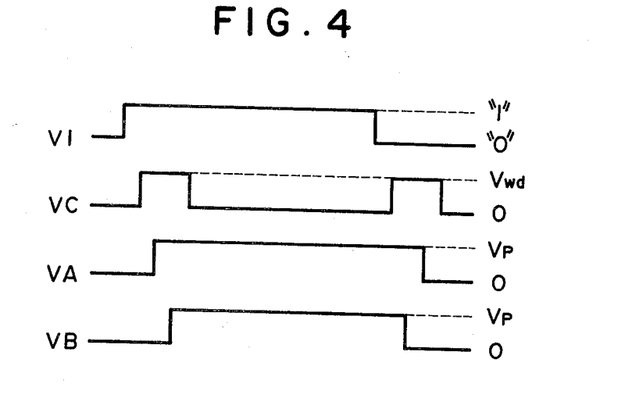
FIG. 4 is a timing chart of voltages in an MNOS transistor, which shows the principle of the present invention.

FIG. 4 is a timing chart to which reference will be made in explaining the principle of a memory driving method according to the present invention. In the figure, V1 is an erasing operation signal similar to that of FIG. 2, VC a voltage at the source 1D and the drain 1E, VA and VB voltages at the gate 1A of non-selected memory cells and the substrate 1F respectively. From FIG. 4, it will be understood that in the invention, the erasing operation signal V1 is applied and when this signal V1 is changed from logic "0" to logic "1" the voltage $V_{wd}$ is subsequently applied, as voltage VC, to the sources 1D and drains 1E of non-selected memory cells not to be erased. Then, the gates 1A are applied with the voltage $V_p$ as VA and next the substrates 1F with $V_p$ as VB. Thereafter, the sources 1D and drains 1E of the non-selected memory cells are brought into the same condition as that of the sources 1D and drains 1E which are in the erased condition. When the erasing operation signal V1 changes from "1" to "0," the substrate voltage VB becomes zero after the source and drain voltage VC in changed to $V_{wd}$, and then the gate voltage VA becomes zero. Subsequently, the source voltage is reduced to zero volts.

Even though there is a potential difference $V_p$ between the gate and substrate voltages, the source and drain are at $V_{wd}$ as voltage VC so that there is no effect on the logic condition of the non-selected memory cells.

For an N-channel MNOS transistor, the voltage $V_p$ is, for example, +25 volts, and the voltage $V_{wd}$ is, for example, +20 volts. For a P-channel MNOS transistor, the voltage $V_p$ is, for example, −25 volts, and the voltage $V_{wd}$ is, for example, −20 volts.

While in the previous example the gate voltage is $V_p$ and the substrate voltage is zero, the gate and substrate voltages may take any values so long as the difference voltage therebetween is $V_p$.

The voltage $V_{wd}$ is selected so that the difference between the voltages $V_p$ and $V_{wd}$ is substantially smaller than a predetermined value.

Moreover, the voltages $V_p$ and $V_{wd}$ are greatly dependent upon the kind of elements used, the time during which the voltages are applied, or other factors as described previously.

Some embodiments of the present invention will hereinafter be described in detail.

Figure 5:
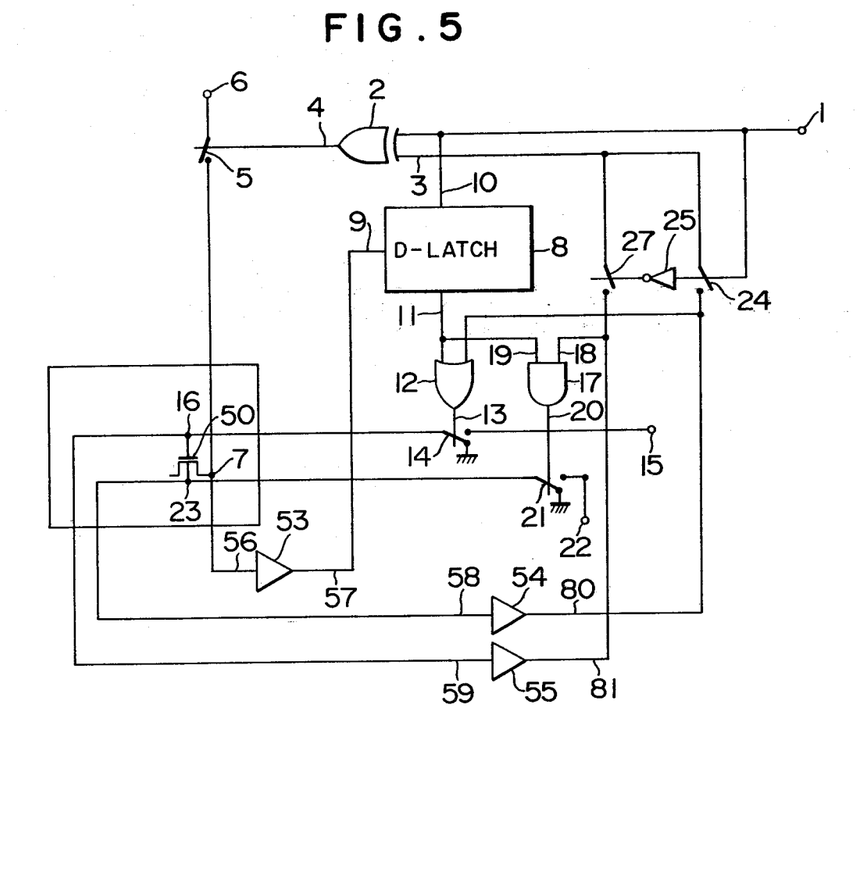
FIG. 5 is a block diagram of one embodiment of the drive circuit which realizes the driving method according to the invention.
Figure 6:
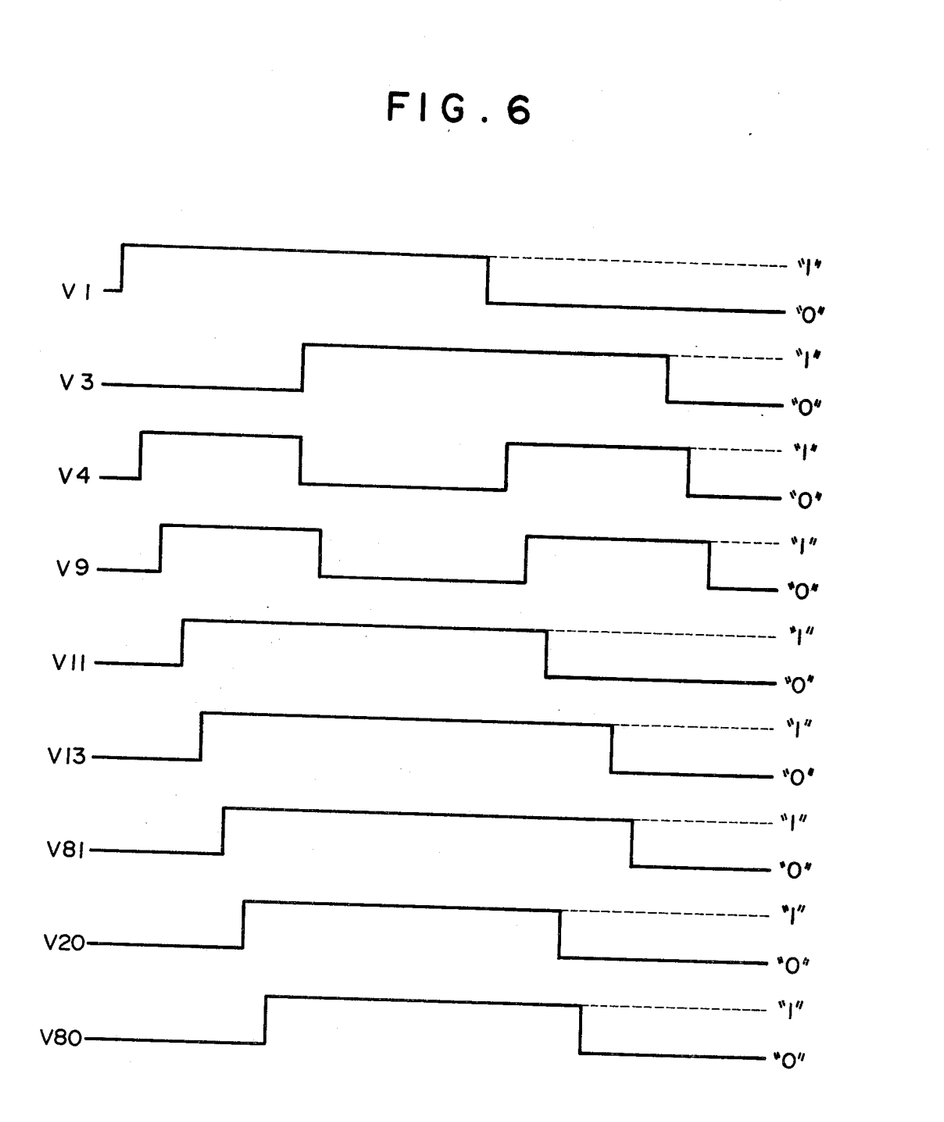
FIG. 6 is a timing chart of voltages at each part of the drive circuit of FIG. 5.

FIG. 5 is a circuit diagram showing one embodiment of the drive circuit which realizes the memory driving method according to the invention. Reference numeral 1 designates an input terminal to which an erasing operation signal is applied, 2 an exclusive OR gate (hereinafter referred to as EOR), 12 an OR gate, 17 an AND gate, 25 an inverter, 5, 14, 21, 24 and 27 switches and 8 a D-latch. FIG. 6 is a timing chart of voltages at each part of the drive circuit of FIG. 5, and the numeral following V indicates the corresponding thermal in the circuit. The switches 5, 14, 21, 24 and 27 are all turned on (connected to the terminals 6, 15, 22, 80 and 81) when logic "1" is applied, and turned off (connected to the ground) at logic "0." The D-latch 8 produces at its output terminal 11 a value itself applied to its input 10 when "1" is applied to the clock terminal 9. When "0" is applied to the clock terminal 9, the latch 8 holds an applied input value just before the application of the "0" level and produces the held value at the output terminal 11. Shown at 53 to 55 are sensors. The sensor 53 produces "1" at its output terminal 57 when the voltage $V_{wd}$ is applied to its input terminal 56, and produces "0" when zero volt is applied to the input terminal 56. The sensors 54 and 55 produce "1" at the output terminals 80 and 81 when the voltage $V_p$ is applied to input terminals 58 and 59 respectively, and produce "0" at the output terminals 80 and 81 when zero volt is applied thereto.

To the terminal 1 there is applied an erasing operation signal whose state is shown by V1 in FIG. 6. One input terminal of the EOR 2 is connected to the terminal 1. If, now, the other input terminal 3 is at "0," the EOR 2 produces "1" at its terminal 4 to turn on the switch 5. Since the voltage $V_{wd}$ has been applied to a terminal 6, the voltage $V_{wd}$ is applied to the source and the drain 7 of a memory cell 50 and thus "1" is applied to the clock terminal 9 of the D-latch 8. Since the input terminal 10 of the D-latch 8 is connected to the terminal 1, the D-latch 8 also produces "1" at its output terminal 11. Since the output terminal 11 is connected to one input terminal of the OR gate 12, the OR gate 12 produces "1" at its output terminal 13. Thus, the switch 14 is connected to a terminal 15. To the terminal 15 there is applied zero volts when the memory cell 50 is in the erased condition, or voltage $V_p$ when the memory 50 is in the non-selected condition. If, now, the memory cell 50 is desired to be in the non-selected condition and thus the voltage $V_p$ is applied to the terminal 15, the memory cell 50 is supplied at its gate 16 with the voltage $V_p$ and the sensor 55 also produces "1" at its output terminal. Since one input terminal 18 of the AND gate 17 is coupled to the output terminal 81 of the sensor 55, and the other input terminal 19 is connected to the output terminal 11 of the D-latch 8, the AND gate 17 produces "1" at its output 20, thereby turning on the switch 21.

The voltage $V_p$ has been applied to a terminal 22, and thus the switch 21 is turned on, to thereby supply the voltage $V_p$ to the substrate 23 of the memory cell 50. The switch 24 has been applied with the erasing operation signal from the terminal 1 and thus is turned on. Thus, the EOR 2 is supplied at its input terminal 3 with "1." Accordingly, the EOR 2 is supplied at its two input terminals 1 and 3 with "1" and hence produces "0" at its output terminal 4. The switch 5 is thus turned off with the result that the source and drain 7 of the memory cell 50 is at zero volt.

Description will next be made of how the drive circuit of FIG. 5 operates when the erasing operation signal is not applied, or the signal V1 has changed from "1" level to "0" level. Since the voltage at the terminal 1 reduces to zero, the EOR 2 is supplied at the one input terminal with "0" and at the other input terminal 3 with "1" so as to produce "1" at its output 4. Thus, the switch 5 is connected to the terminal 6 to supply the voltage $V_{wd}$ to the source and drain 7 of the memory cell 50, and the D-latch 8 is supplied at its clock terminal 9 with "1." Since the D-latch 8 is supplied at its input terminal 10 with "0," the D-latch 8 produces "0" at its output terminal 11. Thus, the AND gate 17 produces "0" at the output terminal 20 to turn off the switch 21, and hence the substrate 23 of the memory cell 50 is at zero volt. Since the OR gate 12 is supplied at the two input terminals with "0," the OR gate 12 produces "0" at its output terminal 13 to turn off the switch 14. Thus, the gate 16 of the memory cell 50 is also at zero volt. The inverter 25, of which the input terminal is connected to the input terminal 1, thus produces "1" at its output to turn on the switch 27. Consequently, the EOR 2 is supplied at its input terminal 3 with "0" and thus produces "0" at its output terminal 4 thereby to turn off the switch 5. Thus, the source and drain 7 of the memory cell 50 is at zero volt.

From the sequential operation of the drive circuit as described above, it will be seen that, when desired not to be erased, the memory cell 50 is never supplied at every instant with any voltage by which the memory cell 50 is operated to be rewritten. In other words, the present invention makes use of the fact that, as described previously, if the voltage $V_{wd}$ is applied to the source and drain of a memory cell, the application of voltage $V_p$ to the gate with the substrate at zero volts will not exert any influence upon the contents of the memory cell.

Figure 7:
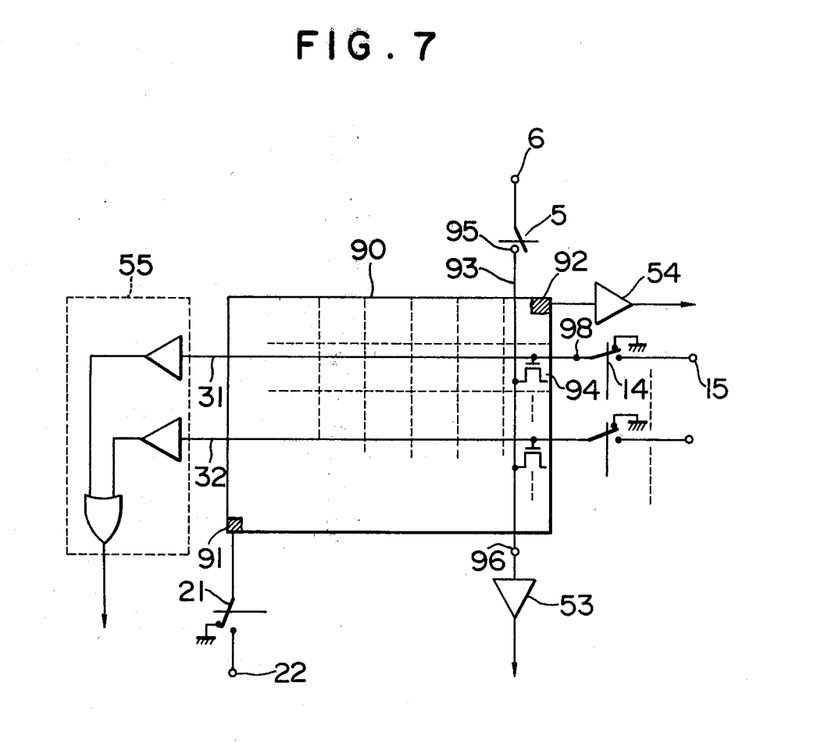
FIG. 7 is a block diagram showing an example of the sensor used in the embodiment of FIG. 5.

This sequence of operations must apply to all the memory cells in the memory array, and hence if the delay time it takes for signals to be transmitted in lines is not taken into consideration, some of the memory cells may have their contents changed due to such a sequence of operations being out of order. To avoid this, there is proposed the embodiment of FIG. 7, in which sence circuits are provided at the opposite side to the voltage source for the memory array, so as to detect that signals have been transmitted to all the parts of the memory array before next operation is performed. Referring to FIG. 7, there are shown the whole wafer substrate 90 of an integrated memory array, and a memory cell 94 thereof. Numeral 91 designates a terminal which is connected to the substrate and electrically connected to the transistor substrate of the entire wafer substrate. When the voltage $V_p$ is applied to the terminal 22 to turn on the switch 21, the $V_p$ is supplied through the terminal 91 to the substrate. A terminal 92 is provided on the substrate at the opposite side to the terminal 91 on the wafer substrate and connected to the sensor 54.

A signal line 93 is connected to the sources of a column of transistors, and one terminal 95 thereof is connected to the switch 5 of which the terminal 6 is at voltage $V_{wd}$. The sensor 53 is connected to the other terminal 96 of the signal line 93. A signal line 31 is connected to the gates of a sideways row of transistors, and one terminal 98 thereof is connected to the switch circuit 14 whose terminal 15 is at zero volt under erasing condition or at $V_p$ volt under non-erasing condition. Therefore, if the sensor 55 is connected only to the signal line 31, since the signal line 31 remains at zero volts under the erasing condition, the sensor 55 cannot detect signal transmission. Thus, since an erasing voltage is applied only to a single line which is connected to gates, the use of an additional signal line 32 on the array with the signal line 31 for the purpose of taking the logic sum of the outputs thereof enables signal transmission to be detected even though one of the two signal lines is at an erasing mode. Thus, the sensors 53 to 55 are provided at the opposite sides to the voltage source, thereby permitting it to be detected that a signal has been transmitted to all the memory cells of the memory array.

While it has been described that detection is first performed of arrival of signal at each memory cell and the next sequence of operation follows, it is possible that time necessary for transmission of signal is calculated in advance and after the time interval for transmission the next sequence of operation begins. An example of this possible case will be described below.

Figure 8:
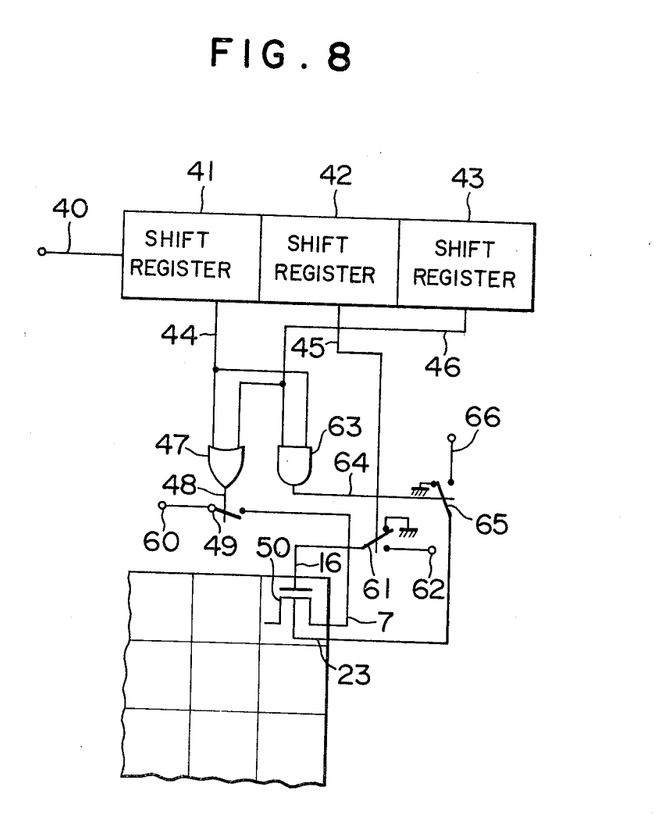
FIG. 8 is a block diagram of another embodiment of the drive circuit which realizes the driving method according to the invention.
Figure 9:
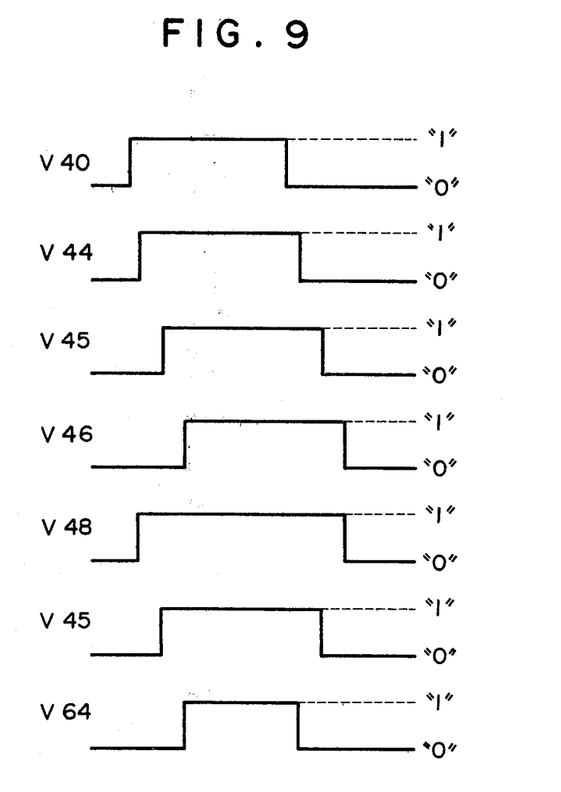
FIG. 9 is a timing chart of voltages at each part of the drive circuit of FIG. 8.

FIG. 8 shows another embodiment of the drive circuit which realizes the memory driving method according to the present invention, and FIG. 9 is a timing chart of the operation of the circuit arrangement of FIG. 8. In FIG. 9, the numeral following V corresponds to the numeral designating each part of the circuit of FIG. 8. Referring to FIG. 8, there are shown shift registers 41 to 43 which are connected to an input terminal 40. An information signal applied to the input terminal 40 is shifted from the register 41 to the registers 42 and 43 in order each time a clock pulse is applied. To the input terminal 40 there is applied an erasing operation signal for memory. FIG. 9 shows output pulses V44 to V46 from the shift registers 41 to 43 respectively and the erasing operation signal at the input terminal 40. The output V44 of the shift register 41 and the output V46 of the shift register 43 are applied to the inputs of an OR gate 47, which then produces an output V48. This output V48 turns on or off a switch 49. All the switches used in this circuit arrangement turn on when applied with logic "1." A terminal 60 is at the voltage $V_{wd}$. When the switch 49 is turned on, the $V_{wd}$ is applied to the source and drain 7 of the memory cell 50. The output 45 of the shift register 42 is applied to a switch 61. An input terminal 62 is at zero volts when the memory cell 50 is in the erasing mode, or at the voltage $V_p$ when the memory cell 50 is in the non-erasing mode. The outputs 44 and 46 of the shift registers 41 and 43 are also applied to an AND gate 63, the output V64 of which turns on or off a switch 65.

An input terminal 66 is at the voltage $V_p$, and when the switch 65 is turned on the voltage $V_p$ is applied to the substrate 23 of the memory cell 50. Thus, as shown in FIG. 9 at V48, V45 and V64, there are formed a sequence of voltages to be applied to the source and drain 7, gate 16 and substrate 23 of the memory cell 50.

In accordance with the present invention as described above, a sequence of voltages to be applied to the respective terminals of each non-selected memory cell is controlled to thereby prevent voltages from being applied to the non-selected memory cells to thereby change the contents thereof when some of the memory cells are erased, so that time during which signals can be held in memory can be extended.

What is claimed is:

1. A memory driving method for erasing the contents of some selected memory cells in an array of memory cells each of which has at least a gate electrode, a substrate and source and drain electrodes, said method comprising a first step of applying a first predetermined voltage to at least one of the source and drain electrodes of each of only those non-selected memory cells not to be erased, and a second step of applying a second predetermined voltage between the gate electrodes and the substrates of only said non-selected memory cells during the application of said first voltage, whereby the contents of said non-selected memory cells are prevented from erroneously changing.

2. A memory driving method for erasing the contents of some selected memory cells in an array of memory cells each of which has at least a gate electrode, a substrate, and source and drain electrodes, said method comprising a first step of applying a first predetermined voltage to at least one of the source and drain electrodes of each of only those non-selected memory cells not to be erased when an erasing operation signal rises up, a second step of applying a second predetermined voltage to the gate electrodes of said non-selected memory cells during the application of said first voltage, and a third step of applying a third voltage substantially equal to said second voltage to the substrates of said non-selected memory cells during the application of said second voltage, whereby the contents of said non-selected memory cells are prevented from erroneously changing at the beginning of the erasing operation.

3. A memory driving method according to claim 2, further comprising a fourth step of applying a fourth voltage substantially equal to said first voltage to said at least one of the source and drain electrodes of each of said non-selected memory cells when said erasing operation signal falls off, a fifth step of lowering said second voltage during the application of said fourth voltage, and a sixth step of lowering said third voltage during the application of said fourth voltage, whereby the contents of said non-selected memory cells are prevented from erroneously changing at the end of the erasing operation.

4. A memory driving method according to claim 2, wherein said second step includes a first phase of detecting said first voltage being applied to said at least one of the source and drain electrodes of each of all of said non-selected memory cells and a second phase of applying said second voltage to the gate electrodes of said non-selected memory cells in response to said detection, and said third step includes a first phase of detecting said second voltage being applied to the gate electrodes of all said non-selected memory cells and a second phase of applying said third voltage to the substrates of said non-selected memory cells in response to said detection.

5. A memory driving method for driving a plurality of memory cells each of which has gate, source and drain electrodes and a substrate and in each of which information is stored when a first predetermined voltage is applied between the gate electrode and the substrate and the stored information is not changed when a second predetermined voltage is applied to at least one of the source and drain electrode and said first voltage is applied between the gate electrode and the substrate, said method comprising, in at least one of the beginning and end of an operation of erasing selected memory cells:

a first step of applying said second voltage to at least one of the source and drain electrode of each of those non-selected memory cells not to be erased, and a second step of applying said first voltage between the gate electrodes and the substrates of said non-selected memory cells during the application of said second voltage in said first step.

6. A memory driving method according to claim 5, further comprising a third step of applying the same voltage to the gate electrodes and the substrates of said non-selected memory cells during the application of said second voltage in said first step.

7. A memory driving method for driving a plurality of memory cells each of which has gate, source and drain electrodes and a substrate and in each of which information is stored when a first predetermined voltage is applied between the gate electrode and the substrate and the stored information is not changed when a second predetermined voltage is applied to at least one of the source and drain electrode and said first voltage is applied between the gate electrode and the substrate, said method comprising:

a first step of applying said second voltage to at least one of the source and drain electrodes of each of those non-selected memory cells not to be erased when an erasing operation signal rises up, a second step of applying said first voltage between the gate electrodes and the substrates of said non-selected memory cells during the application of said second voltage in said first step, and a third step of applying the same voltage to the gate electrodes and the substrates of said non-selected memory cells during the application of said second voltage in said first step.

8. A memory driving method according to claim 7, further comprising:

a fourth step of again applying said second voltage to said at least one of the source and drain electrodes of each of said non-selected memory cells when said erasing operation signal falls off, a fifth step of lowering the voltage applied to the substrates of said non-selected memory cells in said third step, during the application of said second voltage in said fourth step, and a sixth step of lowering the voltage applied to the gate electrodes of said non-selected memory cells in said third step, during the application of said second voltage in said fourth step.

9. A memory driving method according to claim 7 or 8, wherein said second step includes a first phase of detecting said second voltage being applied to all said non-selected memory cells in said first step and a second phase of applying said first voltage between the gate electrodes and the substrates of said non-selected memory cells in response to the detection in said first phase of said second step, and said third step includes a first phase of detecting said first voltage being applied between the gate electrodes and the substrates of all said non-selected memory cells in said second phase of said second step and a second phase of applying the same voltage to the gate electrodes and the substrates of said non-selected cells in response to the detection in said first step of said third step.

* * * * *